United States Patent
Uchida et al.

(10) Patent No.: US 8,203,191 B2
(45) Date of Patent: Jun. 19, 2012

(54) SPIN CURRENT THERMAL CONVERSION DEVICE AND THERMOELECTRIC CONVERSION DEVICE

(75) Inventors: Kenichi Uchida, Miyagi (JP); Kazuya Harii, Miyagi (JP); Yosuke Kajiwara, Miyagi (JP); Eiji Saitoh, Kanagawa (JP)

(73) Assignee: Keio University, Tokyo (JP)

( * ) Notice: Subject to any disclaimer, the term of this patent is extended or adjusted under 35 U.S.C. 154(b) by 118 days.

(21) Appl. No.: 12/743,057

(22) PCT Filed: Nov. 17, 2008

(86) PCT No.: PCT/JP2008/070857
§ 371 (c)(1),
(2), (4) Date: May 14, 2010

(87) PCT Pub. No.: WO2009/066631
PCT Pub. Date: May 28, 2009

(65) Prior Publication Data
US 2010/0276770 A1 Nov. 4, 2010

(30) Foreign Application Priority Data
Nov. 22, 2007 (JP) .................. 2007-302470

(51) Int. Cl.
*H01L 43/06* (2006.01)
(52) U.S. Cl. ............. 257/421; 257/295; 257/E43.002; 257/E42.003; 257/E29.323; 257/E27.006
(58) Field of Classification Search .......... 257/421, 257/295, E43.002, E43.003, E29.323, E27.006
See application file for complete search history.

(56) References Cited

U.S. PATENT DOCUMENTS
2008/0102315 A1* 5/2008 Fukuzawa et al. ......... 428/811.2

OTHER PUBLICATIONS

Kazuya Ando et al. "Spin Pumping ni yoru Gyaku Spin Hall Koka no Kansoku", Kotai Butsuri, Aug. 15, 2007, pp. 19-27, vol. 42, No. 8.
Shuichi Murakami et al. "Dissipationless Quantum Spin Current at Room Temperature", Science, Sep. 5, 2003, pp. 4382-4399, vol. 301.
International Search Report of PCT/JP2008/070857, mailing date of Jan. 27, 2009.
E. Saitoh et al. "Conversion of Spin Current Into Charge Current at Room Temperature: Inverse Spin-Hall Effect", Applied Physics Letters, May 5, 2006, p. 182509, vol. 88.
R.H. Silsbee et al. "Coupling Between Ferromagnetic and Conduction-Spin-Resonance Modes at a Ferromagnetic-Normal-Metal Interface", Physical Review B, May 1, 1979, pp. 4382-4399, vol. 19, No. 9.
K. Uchida et al. "Observation of the Spin Seebeck Effect", Nature, Oct. 9, 2008, pp. 778-781, vol. 455.

\* cited by examiner

*Primary Examiner* — Marc Armand
(74) *Attorney, Agent, or Firm* — Westerman, Hattori, Daniels & Adrian, LLP (57) ABSTRACT

The invention relates to a spin current thermal conversion device and a thermoelectric conversion device, with which a spin current is thermally generated, and its concrete application is realized.
A temperature gradient creating means which creates a temperature gradient in a thermal spin current generating member is provided in a thermal spin current generating member made of either a ferromagnetic member or a conductive member containing a ferromagnetic substance.

6 Claims, 7 Drawing Sheets

SPIN CURRENT THERMAL CONVERSION DEVICE AND THERMOELECTRIC CONVERSION DEVICE

TECHNICAL FIELD

The present invention relates to a spin current thermal conversion device and a thermoelectric conversion device, and in particular, to a spin current thermal conversion device and a thermoelectric conversion device characterized by the structure for generating a spin current using temperature difference.

BACKGROUND ART

In the electronics field for contemporary semiconductor devices, the charge degree of freedom that electrons have is used, and electrons have the spin degree of freedom in addition to that of charge.

In recent years, spintronics where this degree of freedom regarding spin, that is to say, the degree of freedom regarding spin angular momentum, is used has attracted attention as a carrier for information technology for the next generation.

In this type of spintronics, the aim is for the degree of freedom that electrons have regarding charge and spin to be simultaneously used so that new functions and characteristics can be gained. Most of the spintronic functions are driven by a spin current.

Spin currents have little energy that is scattered and lost, and therefore, the probability of a spin current being used for efficient information conveyance is high, and thus, a method for generating and detecting a spin current is urgently required to be established.

As for a method for generating such a spin current, a spin current resulting from spin pumping that can be compared to a current resulting from electromagnetic induction has been proposed (see Non-Patent Document 1, for example), and a spin current resulting from excitation by circularly polarized light that can be compared to a current resulting from photovoltaic power has also been proposed.

In addition, as for a method for detecting a spin current, the present inventors have proposed a method for detecting a spin current using an inverse spin Hall effect, and have found that a current flows in the direction perpendicular to the direction of the pure spin current when a pure spin current is injected into a sample, and thus, there is a difference in potential between the ends of the sample when this inverse spin Hall effect is used, and therefore, it is possible to detect the existence of a flow of a pure spin current by detecting this difference in potential (see Non-Patent Document 2, for example).
Non-Patent Document 1: Phys. Rev., B19, p. 4382, 1979
Non-Patent Document 2: Applied Physics Letters, Vol. 88, p. 182509, 2006

DISCLOSURE OF THE INVENTION

Problem to be Solved by the Invention

In reality, however, no method for thermally generating a spin current that can be compared to a current resulting from thermoelectric power has been proposed.

If a spin current can be generated from temperature difference, it becomes possible to provide a small scale spin current source, and therefore, a thermal spin current is very important from the point of view of not only physics, but also engineering.

Accordingly, an object of the present invention is to thermally generate a spin current, and at the same time, to implement its concrete application.

Means for Solving Problem

Figure 1:
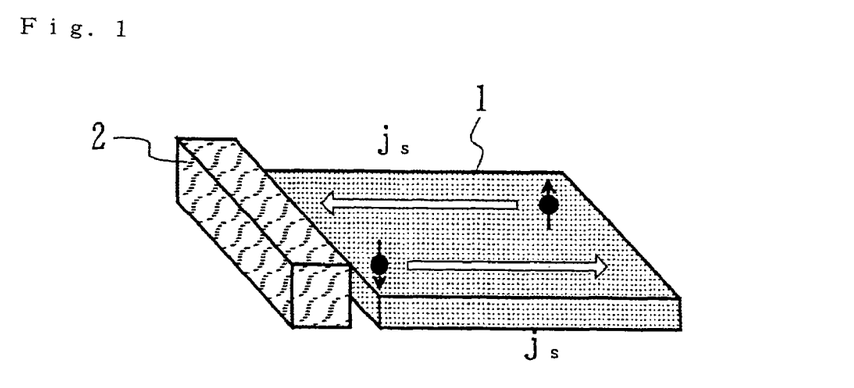
FIG. 1 is a diagram for illustrating the principle structure of the present invention.

Here, the means for solving the problem according to the present invention is described in reference to FIG. 1.

In order to solve the above described problem, the present invention provides a thermal spin current conversion device characterized by having a thermal spin current generating member 1 made of either a ferromagnetic member or a conductive member containing a ferromagnetic substance and a temperature gradient creating means which creates a temperature gradient in the above described thermal spin current generating member 1.

Thus, in the case where an external magnetic field is applied to the thermal spin current generating member 1 or in the case where the thermal spin current generating member 1 itself is magnetized, there is a difference between the up spin current and the down spin current only when a temperature gradient is created in the thermal spin current generating member 1, and therefore, a spin current can be thermally generated. Here, a ferromagnetic substance having different state densities between up spin electrons and down spin electrons is appropriate for the thermal spin current generating member 1, and this is not limited to a pure ferromagnetic substance, but a thermal spin current can also be generated in a conductive member in which a ferromagnetic substance is dispersed in a non-magnetic conductive material.

In this case, the spin current is not a physical conserved quantity, and therefore, a spin current can be continuously taken out by simply creating a temperature gradient when such a thermal spin current conversion device is used as the spin current source.

In addition, a thermally generated pure spin current has a great advantage in that it flows over a long distance, unlike a conventional pure spin current that diffuses while flowing.

That is to say, a conventional pure spin current that diffuses while flowing only flows in a nano region, while a thermally generated pure spin current sufficiently flows as long as there is a temperature gradient even when the thermal spin current generating member 1 is long, and therefore, the thermal spin current conversion device is important as the spin current source for a pure spin current driving device.

In addition, a thermal spin current conversion device may be formed such that a pair of thermal spin current generating members 1 made of either ferromagnetic members or conductive members containing a ferromagnetic substance are connected with a conductive member at one end, and temperature gradients are created in the above described pair of thermal spin current generating members 1 in the same direction in such a condition where magnetic fields are applied to the above described pair of thermal spin current generating members 1 in the opposite directions so that a thermal spin current is taken out from the above described pair of thermal spin current generating members 1 at the other end.

In addition, it is desirable for at least a main portion of the thermal spin current generating member 1 to be amorphous because substances in an amorphous state generally have low thermal conductivity, and therefore, a temperature gradient can be rapidly created, and as a result, the rate of generation of a spin current becomes high.

In addition, a thermoelectric conversion device can be implemented by providing an inverse spin Hall effect member to a thermal spin current generating member as described above made of either a ferromagnetic member or a conductive member containing a ferromagnetic substance at least at one end, and allowing a temperature gradient to be created in, and at the same time, a magnetic field to be applied to the above described thermal spin current generating member 1 so that a spin current is converted to a voltage so as to be taken out in the above described inverse spin Hall effect member.

That is to say, an inverse spin Hall effect member, which is a spin current detecting means, is provided as an output portion, and thus, a thermocouple using a spin current, which can replace a thermoelectric conversion device, that is to say, a thermocouple using Seebeck effect, can be implemented.

In this case, it is desirable for the spin current-electric current conversion member to be either an device having an f orbital with a large spin orbit coupling or Pd, wherein Pt is more desirable, and as a result, the spin current-electric current conversion efficiency becomes high.

In addition, it is desirable to use an anti-ferromagnetic member magnetically coupled with the above described thermal spin current generating member 1 as a magnetic field applying means, and thus, a magnetic field can be applied locally to a small area for detection, and appropriate magnetic fields can be applied even in the case where a temperature gradient is measured when a number of thermocouples in various directions are provided in close proximity.

In this case as well, it is desirable for at least a main portion of the thermal spin current generating member 1 to be amorphous because substances in an amorphous state generally have low thermal conductivity, and therefore, a temperature gradient can be rapidly created, and as a result, the output voltage increases.

Effects of the Invention

According to the present invention, a spin current is generated using temperature difference, and therefore, a compact spin current source can be implemented, and at the same time, a thermocouple can be implemented using a single ferromagnetic substance or a single conductive member where a ferromagnetic substance is dispersed without using a metal junction.

BEST MODE FOR CARRYING OUT THE INVENTION

According to the present invention, a spin current is generated by creating a temperature gradient in a ferromagnetic member or a conductive member in which a ferromagnetic substance is dispersed, that is to say, a thermal spin current is generated, and therefore, the principle for generating a thermal spin current is described below in reference to FIGS. 2 to 7.

First, regarding electron transportation in a ferromagnetic metal in which a temperature gradient is created, a Boltzmann equation with a relaxation time approximation in the following equation (1) can be gained by carrying out a relaxation time approximation on a spin dependent Boltzmann equation.

[Formula 1]

$$\frac{\partial f}{\partial t} + v \cdot \nabla rf = \frac{f(k) - f_0(k)}{\tau(k)} \quad (1)$$

(k: wave number, v: velocity of electrons, $f$: distribution function)

Next, the distribution function f of the Boltzmann equation that is gained by linearly approximating equation (1) is converted to a current $j_c$ represented by the Fermi distribution function in the following equation (2).

[Formula 2]

$$j_c = -\frac{2e}{(2\pi)^3} \int_{1stBZ} v(k) f(k) \, dk \quad (2)$$

Next, a free electron approximation ($\epsilon = m^* v^2/2$)/Sommerfeld development is carried out on the current $j_c$ in the formula 2, and thus, the thermal current $j_c$ can be represented by the following equation (3).

[Formula 3]

$$j_c = \frac{4\pi^2 k_B^2 e}{9m^*} T \left[ D_F \tau_F + \varepsilon_F \frac{\partial D_\uparrow \tau}{\partial \varepsilon} \bigg|_{\varepsilon_F} \right] \nabla T \quad (3)$$

($\epsilon_F$: Fermi energy, D: state density, $\tau$: relaxation time)

The state density D and the relaxation time $\tau$ in this thermal current $j_c$ have spin dependency, and therefore, the spin current resulting from up spin electrons and the spin current resulting from down spin electrons can be represented by the following equations (4) and (5).

[Formula 4]

$$j_\uparrow = \frac{4\pi^2 k_B^2 e}{9m^*} T \left[ (D_\uparrow \tau_\uparrow)_{\varepsilon_F} + \varepsilon_F \frac{\partial D_\uparrow \tau_\uparrow}{\partial \varepsilon} \bigg|_{\varepsilon_F} \right] \nabla T \quad (4)$$

$$j_\downarrow = \frac{4\pi^2 k_B^2 e}{9m^*} T \left[ (D_\downarrow \tau_\downarrow)_{\varepsilon_F} + \varepsilon_F \frac{\partial D_\downarrow \tau_\downarrow}{\partial \varepsilon} \bigg|_{\varepsilon_F} \right] \nabla T \quad (5)$$

Here, the thermal spin current $j_s$ is the difference between the spin current resulting from up spin electrons and the spin current resulting from down spin electrons, and therefore, can be represented by the following equation (6).

[Formula 5]

$$j_s = \frac{4\pi^2 k_B^2 e}{9m^*} T \left[ (D_\uparrow \tau_\uparrow - D_\downarrow \tau_\downarrow)_{\varepsilon_F} + \varepsilon_F \frac{\partial (D_\uparrow \tau_\uparrow - D_\downarrow \tau_\downarrow)}{\partial \varepsilon} \bigg|_{\varepsilon_F} \right] \nabla T \quad (6)$$

Here, the first term that is the product of the state density D and the relaxation time τ in the right side of equation (6) is very small in comparison with the second term that is the energy differential of the product of the state density D and the relaxation time τ, and therefore, the second term becomes dominant.

Figure 2:
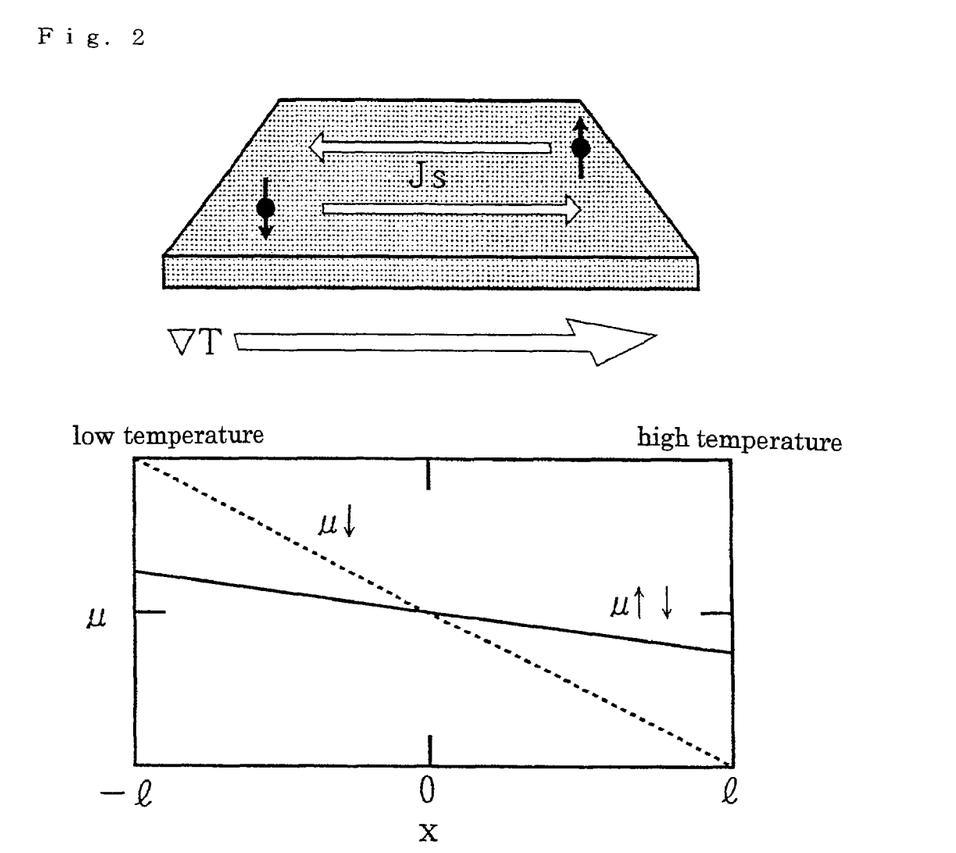
FIG. 2 is a diagram for illustrating the spin concentration gradient.

FIG. 2 is a diagram for illustrating the spin concentration gradient, and it can be seen from the above equation (6) for the thermal spin current and the Fert-Valet equation that the chemical potential μ↑ of the up spin electrons and the chemical potential μ↓ of the down spin electrons are opposite between the low temperature side and the high temperature side, and therefore, a spin concentration gradient is created.

Accordingly, a spin accumulation starts such that the up spin is which a temperature gradient is created, while the down spin is accumulated on the low temperature of the ferromagnetic metal.

When such a spin current is generated, the spin current can be detected by using the inverse spin Hall effect, and therefore, the test for verifying this is described below in reference to FIGS. 3 to 7.

Figure 3:
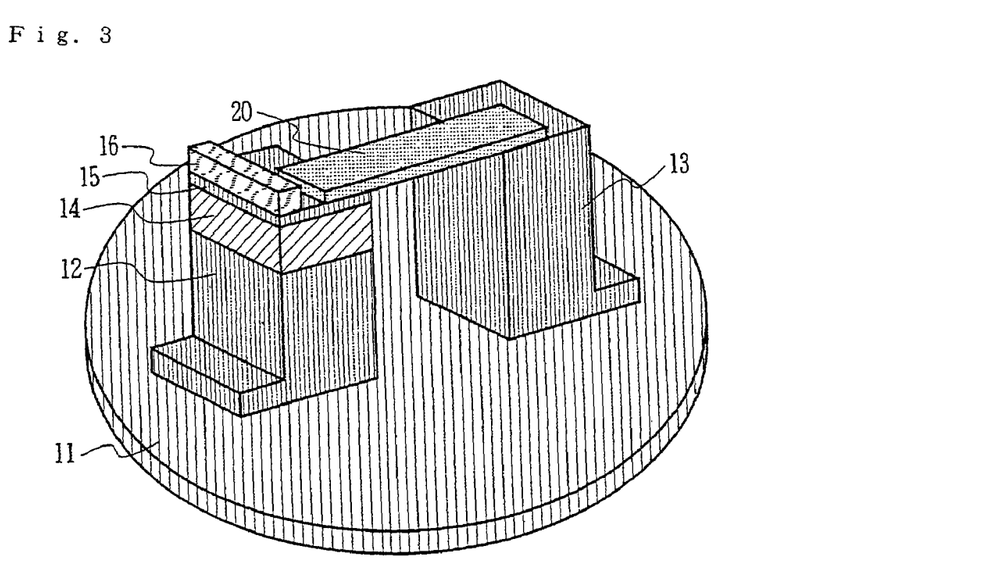
FIG. 3 is a diagram for illustrating the structure of a thermal spin current detecting system using the inverse spin Hall effect.

FIG. 3 is a diagram showing the structure of a thermal spin current detecting system using the inverse spin Hall effect, and a pair of Cu blocks 12, 13 are provided on a stainless base 11 where a Cu plate 15 is provided to one Cu block with a heat insulating material 14 in between, and a sample 20 is bridged between this Cu plate 15 and the other Cu block 13.

In addition, a heater 16 is provided to the other end of the Cu plate 15 so that one end of the sample 20 is heated by this heater 16, and at the same time, the other end of the sample 20 is kept at a constant temperature in a heat bath so that a temperature gradient is created between the two ends.

Here, this temperature gradient is defined by the temperature difference between the two ends, which are measured by a pair of thermocouples that are provided in the proximity of the respective ends of the sample 20.

Figure 4:
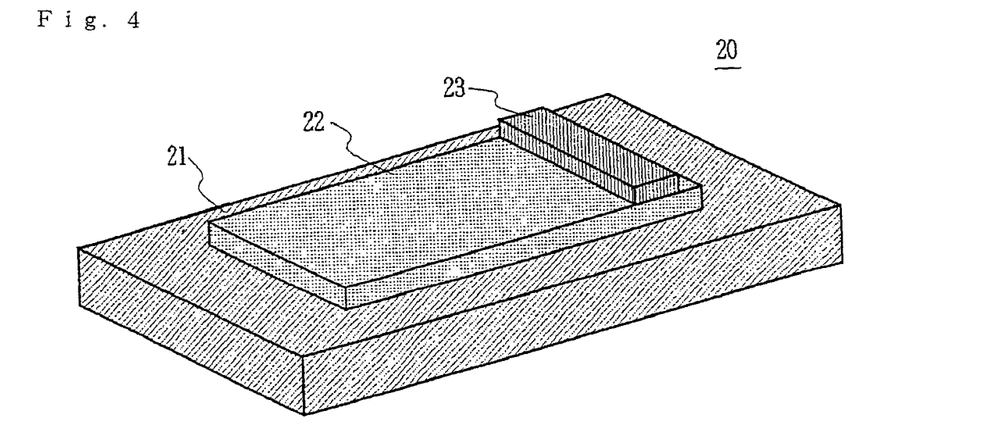
FIG. 4 is a schematic diagram showing the structure of a sample.

FIG. 4 is a schematic diagram showing the structure of a sample, and one end of an $Ni_{81}Fe_{19}$ film 22 having a length of 7 mm, a width of 4 mm and a thickness of 10 nm on a sapphire substrate 21 is provided with a Pt electrode 23 having a length of 4 mm, a width of 100 μm and a thickness of 10 nm, for example.

As for the substrate in this case, a sapphire substrate having a thermal conductivity lower than Si in which a temperature gradient is easily created is used.

Figure 5:
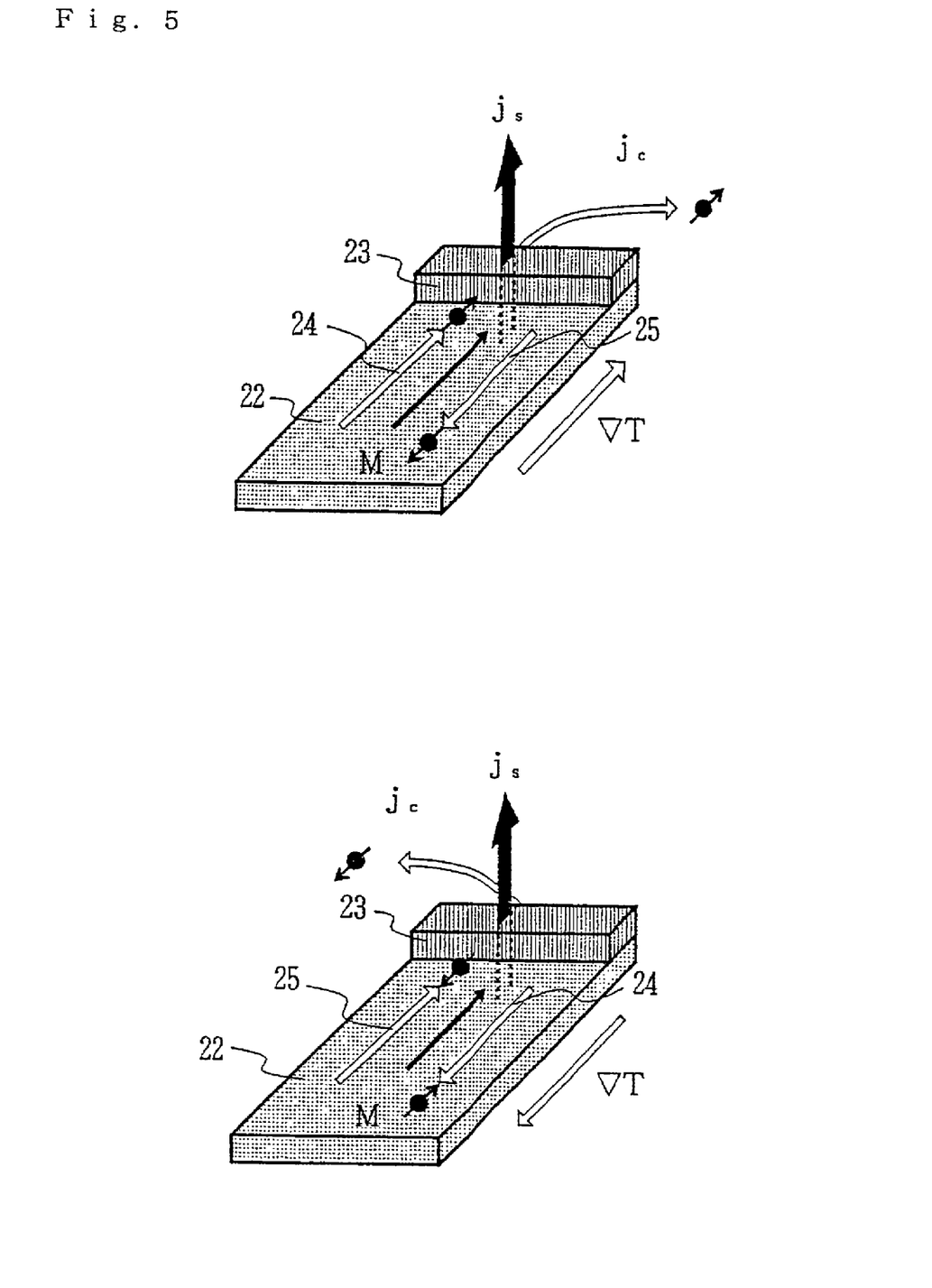
FIG. 5 is a diagram for illustrating the principle for detecting a thermal spin current.

FIG. 5 is a diagram for illustrating the principle for detecting a thermal spin current, where the upper half shows a case where the side on which the Pt electrode 23 is provided is a high temperature side and the lower half shows a case where the side on which the Pt electrode 23 is provided is a low temperature side.

When a fixed magnetic field H is applied, the spin current $j_s$ is converted to a current $j_c$ due to the spin orbit coupling of Pt in the case where a thermal spin current $j_s$ generated in the $Ni_{81}Fe_{19}$ film 22 due to the temperature gradient ∇T, that is the thermal spin current 24 resulting from the up spin in the case of the upper half and the thermal spin current 25 resulting from the down spin in the case of the lower half, is injected into the Pt electrode 23.

At this time, the current $j_c$ flows in the direction perpendicular to the direction of the spin current $j_s$, and there is a difference in the potential V in the direction in accordance with the direction of the spin of the spin current that is injected into the two ends of the Pt electrode 23 in each case.

The direction of the difference in the potential V at this time can be reversed depending on the direction of the applied fixed magnetic field H, and therefore, the difference in the potential V for a certain fixed magnetic field H and the difference in the potential V for a fixed magnetic field H of which the direction is reversed can be measured so that the existence of a thermal spin current can be detected.

Here, in the case where the direction of the difference in the potential V is not reversed even when the magnetic field is reversed, noise is created instead of a thermal spin current.

Figure 6:
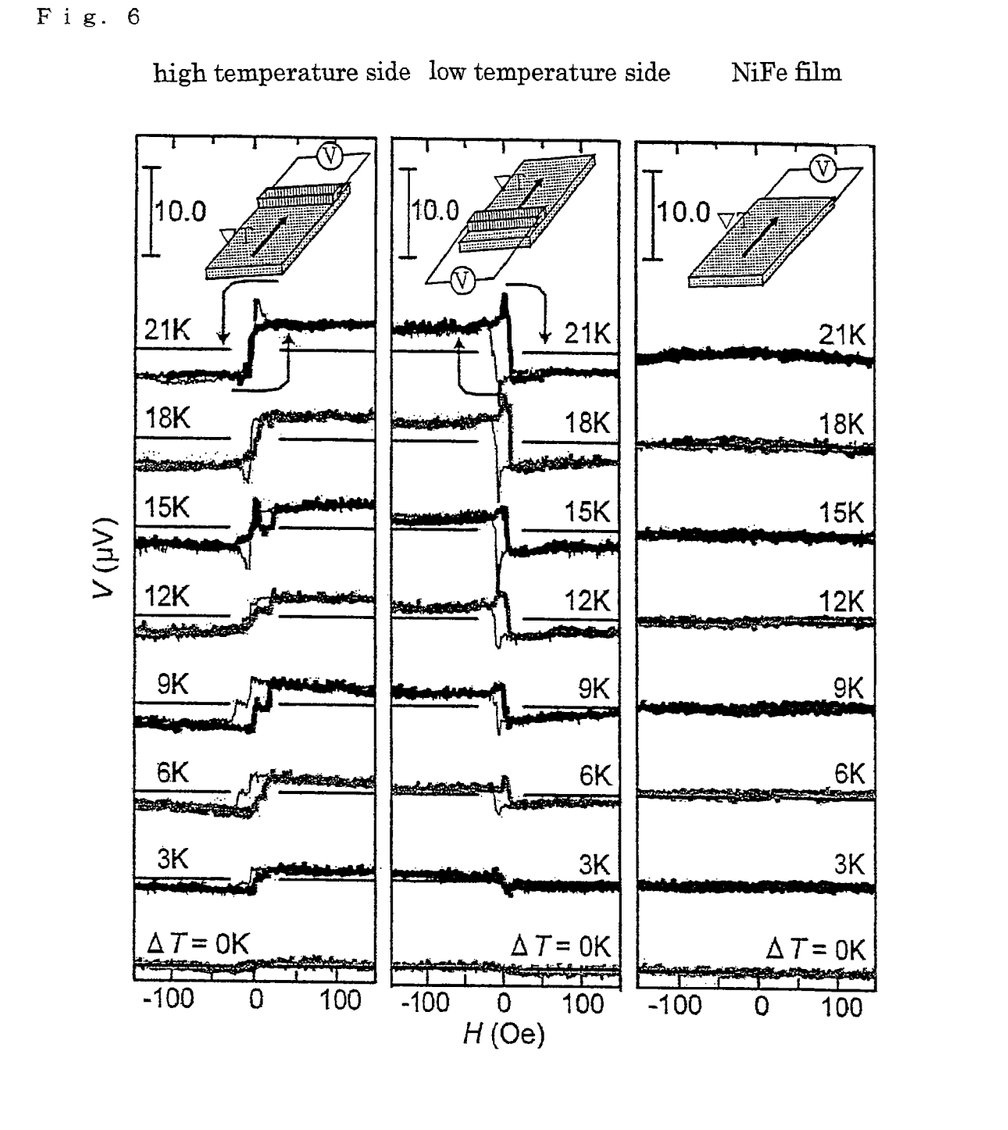
FIG. 6 is a diagram for illustrating the results of measurement.

FIG. 6 is a diagram for illustrating the results of the measurement, where the left diagram is a graph showing the results of the measurement for the sample on the low temperature side, the middle diagram is a graph showing the results of the measurement for the sample on the high temperature side, and the right diagram is a graph showing a case where the difference in the potential is measured when an electrode is directly provided on $Ni_{81}Fe_{19}$.

In this case, the measurements are carried out when a magnetic field, up to 150 [Oe] at which $Ni_{81}Fe_{19}$ magnetization is saturated, is applied as the applied magnetic field H, and the graphs show the outputs in the case where the magnetic field varies from −150 [Oe] to +150 [Oe] for each temperature difference (wide lines) and the outputs in the case where the magnetic field varies from +150 [Oe] to −150 [Oe] (narrow lines) where the outputs are superimposed.

As is clear from the left diagram, the dependency of the detected difference in the potential V can be observed on the high temperature side, and a difference in the potential of approximately 8 μV was detected when the temperature difference ΔT was 21 K, for example.

This difference in the potential V is reversed in the direction when the direction of the applied magnetic field is reversed, and therefore, the difference in the potential can be regarded as resulting from the thermal spin current.

In addition, though as not clear as on the high temperature side, the dependency of the difference in the potential V on the temperature difference can be observed on the low temperature side, and a difference in the potential of approximately 5 μV was detected when the temperature difference ΔT was 21K.

At this time, hysteresis can be observed in the output voltage in the vicinity of zero in the magnetic field, and the existence of hysteresis indicates that the output voltage changes as a result of the reversal in the direction of the magnetization of the ferromagnetic metal layer.

Here, as shown in the right part, no clear difference in the potential can be detected in the case where no Pt electrode having a large spin orbit coupling is provided.

This simply indicates that no spin current can be detected as being generated in accordance with the principle of the inverse spin Hall effect because no Pt electrode is provided and does not mean that no thermal spin current is generated.

Figure 7:
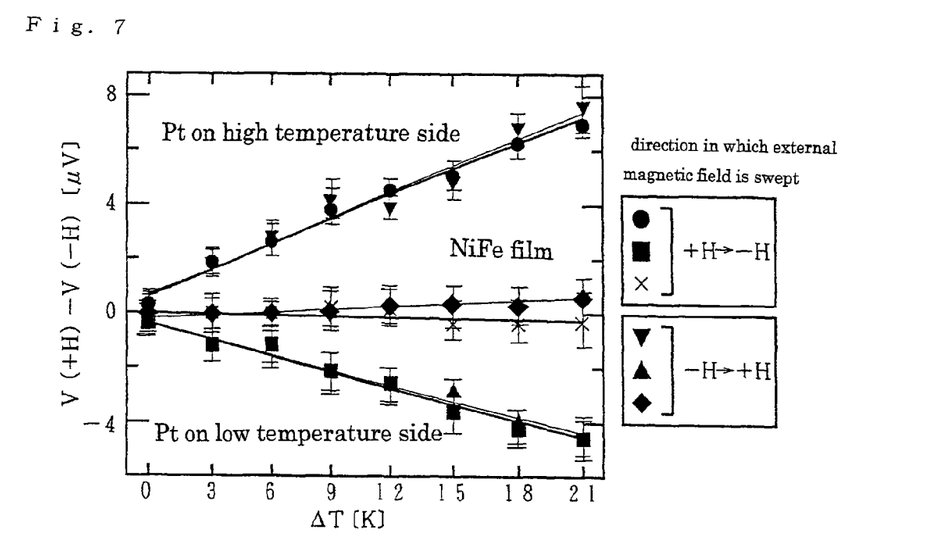
FIG. 7 is a graph showing the output characteristics in FIG. 6 arranged from the point of view of the dependency on the difference in temperature.

FIG. 7 is a graph showing the output characteristics in FIG. 6 arranged from the point of view of the dependency on the difference in temperature, and it can be seen from this that the output voltage changed approximately linearly relative to the temperature difference ΔT both on the high temperature side and the low temperature side.

Thus, a small scale spin current source can be provided when a temperature gradient is created in a ferromagnetic metal, and it can be seen that the amount of generated thermal spin current $j_s$ can be approximately linearly controlled by the temperature gradient created in the ferromagnetic metal.

In addition, this can be viewed from the opposite point of view that the temperature difference $\Delta T$ K in $Ni_{81}Fe_{19}$ can be found from the difference in the potential V of the Pt electrode, and the temperature at one end is $(T_0+\Delta T)$ K when the other end has a constant temperature $T_0$ K in a heat bath, and the temperature difference between the two ends is $\Delta T$ K, for example, and therefore, this device can be used as a thermoelectric conversion device for measuring the temperature in a predetermined part, that is to say, as a thermocouple.

First Embodiment

The thermal spin current conversion device according to the first embodiment of the present invention is described below in reference to FIG. 8.

Figure 8:
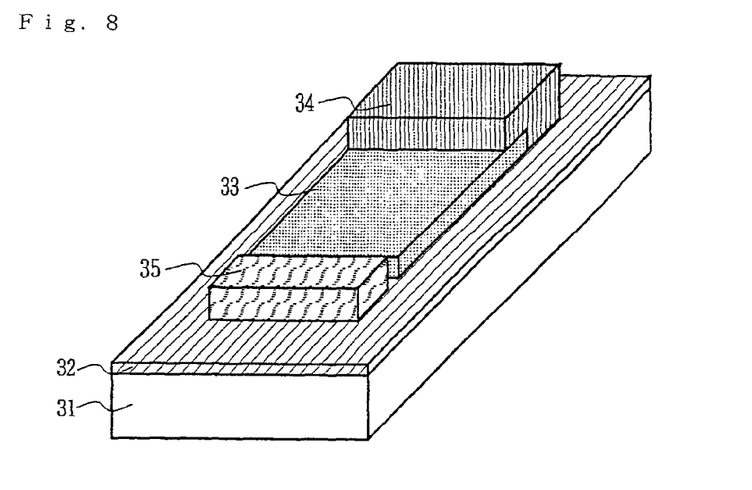
FIG. 8 is a schematic perspective diagram showing the thermal spin current conversion device according to the first embodiment of the present invention.

FIG. 8 is a schematic perspective diagram showing the thermal spin current conversion device according to the first embodiment of the present invention, where an $Ni_{81}Fe_{19}$ film 33 having a length of 7 mm, a width of 4 mm and a thickness of 10 nm is formed by a sputtering method using a mask on the surface of the thermal oxidation film 32 provided on the surface of a silicon substrate 31, for example, and a heat sink 34 made of Cu is provided at one end of the $Ni_{81}Fe_{19}$ film 33 so that this side becomes the low temperature side while a heater 35 is provided in the vicinity of the other end so that this side becomes the high temperature side, for example.

In this case, a temperature gradient is created between the side on which the heat sink 34 is provided and the side on which the heater 35 is provided when the end is heated by the heater 35 so that a thermal spin current $j_s$ is generated in the direction of the temperature gradient, and the up spin is accumulated on the high temperature side while the down spin is accumulated on the low temperature side.

This accumulated spin is taken out through electrical connection, and thus, a thermal spin source is formed.

As described above, a thermal spin current can be generated by simply creating a thermal gradient in a ferromagnetic substance, and thus, a compact spin current source can be formed for spintronic devices, such as spin current circuits, spin current computers and spin memories.

Second Embodiment

Figure 9:
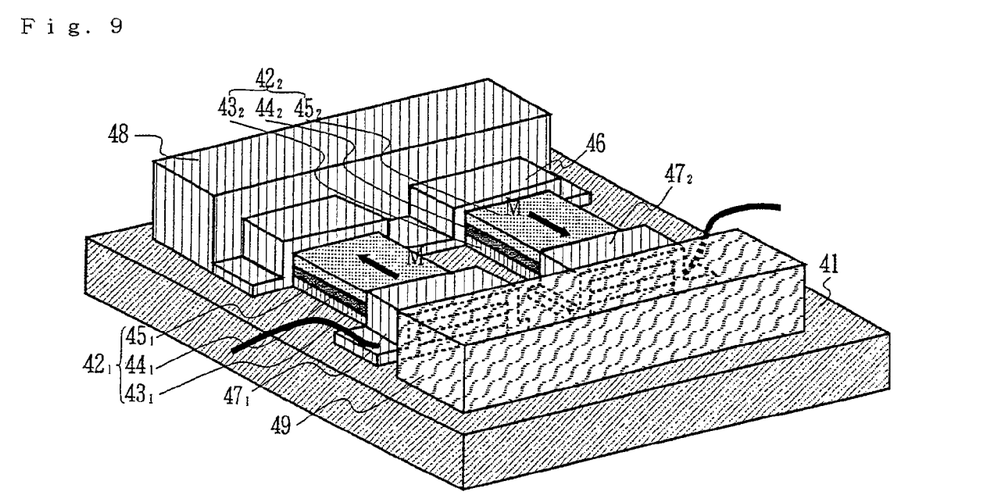
FIG. 9 is a schematic perspective diagram showing the thermal spin current conversion device according to the second embodiment of the present invention.

Next, the thermal spin current conversion device according to the second embodiment of the present invention is described in reference to FIG. 9

FIG. 9 is a schematic perspective diagram showing the thermal spin current conversion device according to the second embodiment of the present invention, where Ta films $43_1$ and $43_2$, PdPtMn films $44_1$ and $44_2$ as well as NiFe films $45_1$ and $45_2$ having a length of 5 mm and a width of 2 mm, are deposited in sequence on the surface of a sapphire substrate 41 by a mask sputtering method so that a pair of thermal spin current conversion parts $42_1$ and $42_2$ are formed.

Here, the PdPtMn films $44_1$ and $44_2$ are formed in such a condition that external magnetic fields having opposite directions of magnetization M are applied during the process for forming the PdPtMn films $44_1$ and $44_2$.

Next, the pair of thermal spin current conversion parts $42_1$ and $42_2$ are connected with a connection part 46 made of Cu having a long spin diffusion length at one end, and at the same time, output terminals $47_1$ and $47_2$ made of Cu are provided to the respective thermal spin current conversion parts $42_1$ and $42_2$ at the other end.

In addition, the connection part 46 makes contact with a heat sink 48 made of Cu, thus providing the low temperature side, while a heater 49 is provided in the vicinity of the pair of output terminals $47_1$ and $47_2$, thus providing the high temperature side.

In this case, a temperature gradient is created between the connection parts 46 side and the output terminals $47_1$ and $47_2$ side when the heater 49 is heated so that a thermal spin current $j_s$ is generated in the direction of the temperature gradient, where the direction of the thermal spin current $j_s$ is opposite between the pair of thermal spin current conversion parts $42_1$ and $42_2$ due to the direction of magnetization M, and therefore, a load can be connected between the output terminals $47_1$ and $47_2$ so that a closed circuit is formed with a spin current being injected into the load.

Third Embodiment

Figure 10:
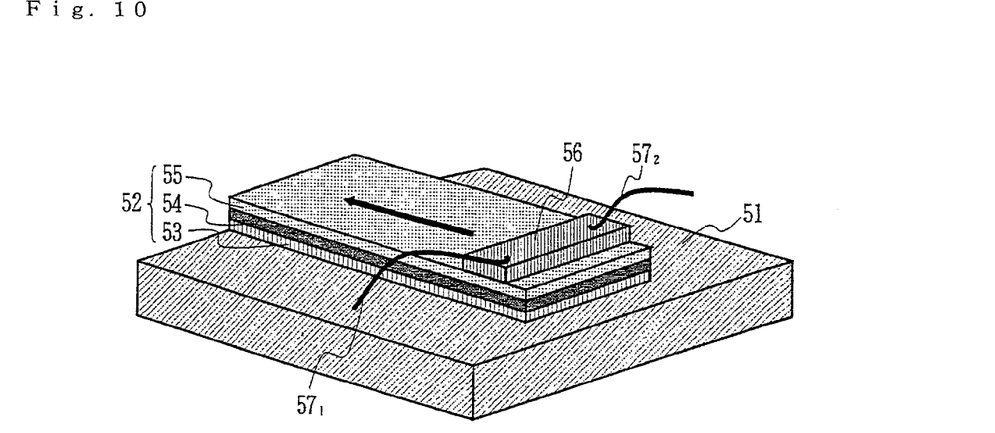
FIG. 10 is a schematic perspective diagram showing a thermocouple using the thermal spin current conversion device according to the third embodiment of the present invention.

Next, a thermocouple using the thermal spin current conversion device according to the third embodiment of the present invention is described in reference to FIG. 10.

FIG. 10 is a schematic perspective diagram showing a thermocouple using the thermal spin current conversion device according to the third embodiment of the present invention, where a Ta film 53, a PdPtMn film 54 and an NiFe film 55 having a length of 10 mm and a width of 5 mm are deposited in sequence on the surface of a sapphire substrate 51 by a mask sputtering method so that a thermal spin current conversion part 52 is formed, for example.

Here, the PdPtMn film 54 is formed in such a condition that an external magnetic field is applied such that the longitudinal direction of the PdPtMn film 54 becomes the direction of magnetization M during the process for forming the PdPtMn film 54.

Next, a Pt electrode 56 is provided on the low temperature side and terminals $57_1$ and $57_2$ are provided at the two ends of this Pt electrode 56 so that a thermocouple using a spin current, that is to say, a thermal spin couple, is formed.

Here, the side on which the Pt electrode 56 is not provided makes contact with or is in proximity to the heat source that is the object to be measured, and thus, a temperature gradient is created between the sides on which the Pt electrode 56 is provided and not provided so that a thermal spin current is generated. When the generated thermal spin current is injected into the Pt electrode 56, there is a difference in the potential between the two ends of the Pt electrode 56 due to the inverse spin Hall effect, and therefore, it becomes possible to estimate the temperature of the heat source that is the object to be measured by detecting this difference in the potential via the terminals $57_1$ and $57_2$.

In this case, it is desirable to measure the temperature with high precision when the low temperature side on which the Pt electrode 56 is provided makes contact with a constant temperature medium.

Fourth Embodiment

Figure 11:
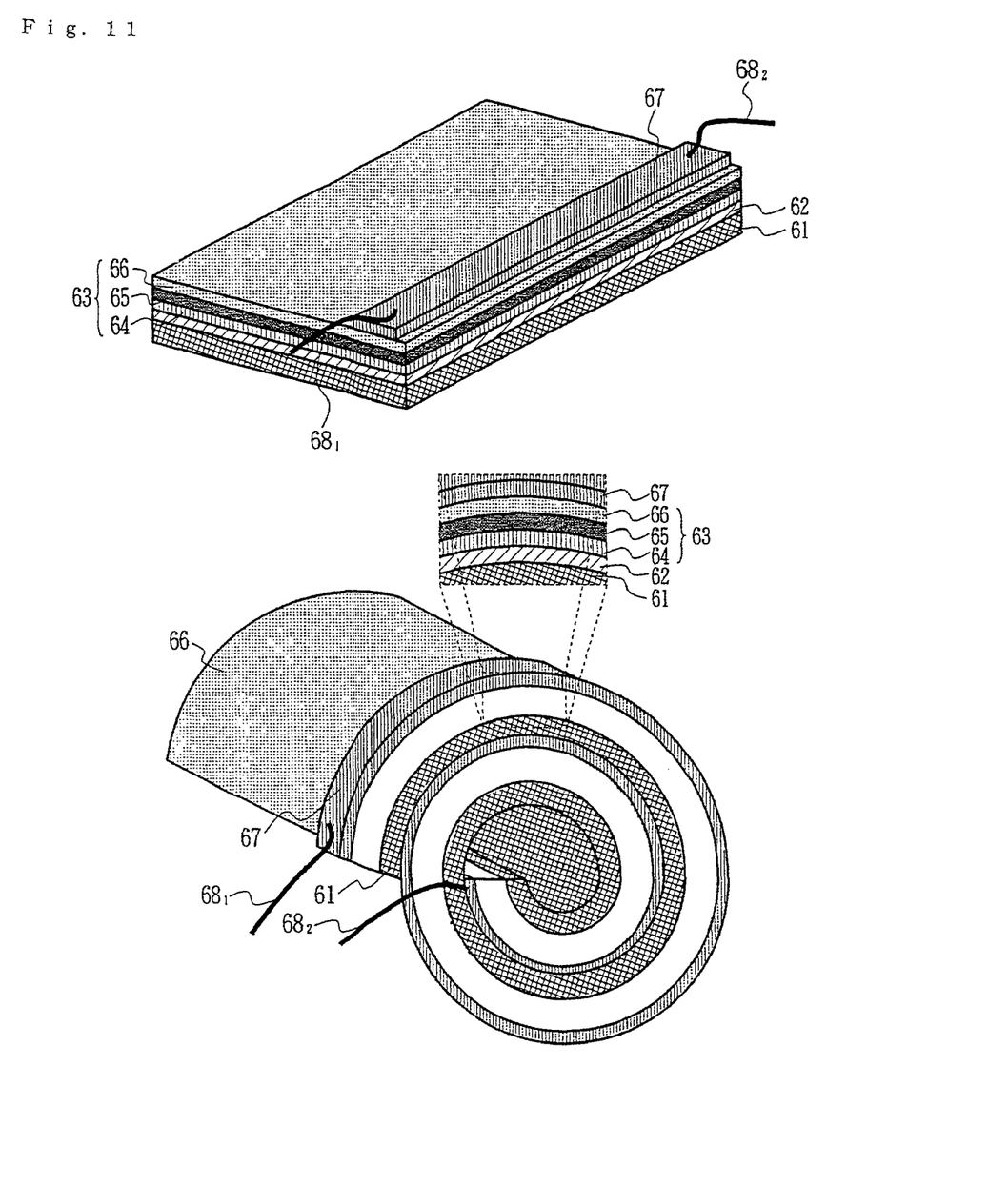
FIG. 11 is a diagram showing the structure of a thermocouple using the thermal spin current conversion device according to the fourth embodiment of the present invention.

Next, a thermocouple using the thermal spin current conversion device according to the fourth embodiment of the present invention is described in reference to FIG. 11.

FIG. 11 is a diagram showing the structure of a thermocouple using the thermal spin current conversion device according to the fourth embodiment of the present invention, where the upper half is a schematic perspective diagram showing a thermocouple during fabrication and the lower half is a schematic perspective diagram showing the thermocouple during use.

An $SiO_2$ film 62 is provided on the surface of a heat resistant fiber film 61, and after that, a Ta film 64, a PdPtMn film 65 and an NiFe film 66 having a length of 7 mm and a width of 200 mm are deposited in sequence by a mask sputtering method so that a thermal spin current conversion part 63 is provided, for example.

Here, the PdPtMn film 65 is formed in such a condition that an external magnetic field is applied so that the longitudinal direction of the PdPtMn film 65 becomes the direction of magnetization M during the process for forming the PdPtMn film 65.

Next, a Pt electrode 67 having a width of 100 μm is provided on the low temperature side and terminals $68_1$ and $68_2$ are provided at the two ends of this Pt electrode 67 so that a thermocouple using a spin current, that is to say, a thermal spin couple, is formed.

Here, the heat resistant fiber film 61 in this case may have resistance to heat at 500° C. or higher, and a glass fiber film, a ceramic compound fiber film, a silica fiber film or an alumina fiber film is used, for example.

Then, the thermocouple is rolled and made compact in a cake roll form so that the heat resistant fiber film 61 is on the inside as shown in the lower half of the figure.

In this thermocouple as well, when the side on which the Pt electrode 67 is not provided makes contact or is in proximity to the heat source that is the object to be measured, a temperature gradient is created between the sides on which the Pt electrode 67 is provided and not provided so that a thermal spin current is generated. When the generated thermal spin current is injected into the Pt electrode 67, there is a difference in the potential between the two ends of the Pt electrode 67 due to the inverse spin Hall effect, and therefore, it becomes possible to estimate the temperature of the heat source that is the object to be measured by detecting this difference in the potential via the terminals $68_1$ and $68_2$.

In this fourth embodiment, the width of the thermal spin current conversion part is wide, and therefore, the temperature can be detected with high sensitivity because the wider the width of the sample is, the higher the inverse spin voltage is.

In addition, a highly sensitive thermometer can be formed with an increase in the number of turns without scaling up the entire configuration because an increase in the width may be rolled around in the cake roll form.

In addition, the thermometer can be viewed from a different point of view in such a manner that a high voltage is outputted when the number of turns is high, and therefore, this can also be used as a high voltage generator using thermoelectric conversion.

Though the modes and the embodiments of the present invention are described in the above, the present invention is not limited to the structures and conditions in the modes and the embodiments, and various modifications are possible.

For example, though Pt is used for the spin injecting electrodes in the above described embodiments, this is not limited to Pt, and any other conductor may be used; however, Pd having a large spin orbit coupling like Pt and an element, such as Au, having an f orbital like Pt are desirable.

In addition, though NiFe is used as the ferromagnetic substance in the above described modes and embodiments, this is not limited to NiFe, and other ferromagnetic substances, such as Ni, Co, CoFe and CoNiFe, may be used.

In addition, though the crystal state of the ferromagnetic substance is not referred to in the above described modes and embodiments, it is desirable for it to be amorphous, which provides resistance higher than polycrystal, and as a result, the thermal conductivity becomes lower, which makes it easy to create a temperature gradient in the ferromagnetic substance.

Here, the temperature of the substrate during the film formation may be a low temperature, such as room temperature, in order to make the ferromagnetic substance be in an amorphous state.

In addition, though the thermal spin current generating parts are formed of a ferromagnetic metal in the above described modes and embodiments, it is not necessary for it to be a ferromagnetic metal, and a conductive member where a ferromagnetic substance is dispersed in a metal, such as Cr, may be used, for example, so that a thermal spin current is generated in the ferromagnetic substance dispersed in the metal and a thermal spin current flows throughout the conductive member.

In addition, though PdPtMn is used for the anti-ferromagnetic layers in the above described second to fourth embodiments, other anti-ferromagnetic substances, such as IrMn, may be used, and in the case where IrMn is used, the structure can allow an anti-ferromagnetic layer to be provided on top of the ferromagnetic layer.

Industrial Applicability

Though thermocouples are typical examples to which the present example is applied, the application of the present invention is not limited to thermocouples, and the invention can be applied to a compact spin current source for spintronic devices, such as spin current circuits, spin current computers and spin memories.

The invention claimed is:

1. A thermal spin current conversion device, comprising:
   a first thermal spin current generating member made of either a ferromagnetic member or a conductive member containing a ferromagnetic substance; and
   a temperature gradient creating means which creates a temperature gradient in said thermal spin current generating member the thermal spin current conversion device comprises a second thermal spin current generating member made of either ferromagnetic members or conductive members containing a ferromagnetic substance, wherein said first thermal spin current generating member and second thermal spin current generating member are connected with a conductive member at one end, and temperature gradients are created in said pair of said first and second thermal spin current generating members in the same direction in such a condition where magnetic fields are applied to said pair of thermal spin current generating members in the opposite directions so that a thermal spin current is taken out from said pair of thermal spin current generating members at the other end.

2. The thermal spin current conversion device according to claim 1, wherein at least a main part of the first thermal spin current generating member is amorphous.

3. A thermoelectric conversion device, comprising:
   a thermal spin current generating member made of either a ferromagnetic member or a conductive member containing a ferromagnetic substance at least at one end;
   a temperature gradient creating means to create a temperature gradient in said thermal spin current generating member; and
   an inverse spin Hall effect member provided to said thermal spin current generating member,
   wherein when a temperature gradient is created in, and at the same time, a magnetic field is applied to said thermal spin current generating member so that a spin current is converted to a voltage so as to be taken out in said inverse spin Hall effect member.

4. The thermoelectric conversion device according to claim 3, wherein said spin current-current conversion member is made of either an element having an f orbital or Pd.

5. The thermoelectric conversion device according to claim 3, wherein said magnetic field applying means is an anti-ferromagnetic member magnetically combined with said first thermal spin current generating member.

6. The thermoelectric conversion device according to claim 3, wherein at least a main portion of said thermal spin current generating member is amorphous.

* * * * *